(12) United States Patent
Zhang et al.

(10) Patent No.: US 9,249,496 B2
(45) Date of Patent: Feb. 2, 2016

(54) METHOD FOR MANUFACTURING LIQUID CRYSTAL DEVICE

(75) Inventors: Huiping Zhang, Suwa (JP); Hideo Nakata, Suwa (JP); Shinsuke Seki, Chino (JP); Takao Tanaka, Suwa (JP)

(73) Assignee: Seiko Epson Corporation (JP)

( * ) Notice: Subject to any disclaimer, the term of this patent is extended or adjusted under 35 U.S.C. 154(b) by 1096 days.

(21) Appl. No.: 12/434,111

(22) Filed: May 1, 2009

(65) Prior Publication Data

US 2009/0283401 A1    Nov. 19, 2009

(30) Foreign Application Priority Data

May 15, 2008   (JP) .................. 2008-128031

(51) Int. Cl.
*C23C 14/00* (2006.01)
*C23C 14/18* (2006.01)
*C23C 14/10* (2006.01)
*C23C 14/58* (2006.01)
*C09K 3/10* (2006.01)
*C09K 17/36* (2006.01)
*C09K 17/38* (2006.01)
*C23C 14/22* (2006.01)

(52) U.S. Cl.
CPC ............. *C23C 14/226* (2013.01); *C09K 3/1018* (2013.01); *C09K 17/36* (2013.01); *C09K 17/38* (2013.01); *C23C 14/185* (2013.01); *C23C 14/584* (2013.01); *C23C 14/10* (2013.01)

(58) Field of Classification Search
CPC .. C23C 14/185; C23C 14/584; C23C 14/226; C09K 3/1018; C09K 17/36; C09K 17/38
USPC .......... 204/192.15, 192.26; 349/94, 125, 131, 349/136
See application file for complete search history.

(56) References Cited

U.S. PATENT DOCUMENTS 5,124,825 A * 6/1992 Asano et al. .................. 349/136
5,305,131 A * 4/1994 Terada et al. ................. 349/172

FOREIGN PATENT DOCUMENTS

| JP | 07-056550 | 6/1995 |
| JP | 2007-127757 | 5/2007 |
| JP | 2007-206535 | 8/2007 |
| JP | 2007-286401 | 11/2007 |

* cited by examiner

*Primary Examiner* — Michael Band
(74) *Attorney, Agent, or Firm* — Harness, Dickey & Pierce, P.L.C.

(57) ABSTRACT

A method for manufacturing a liquid crystal device that includes forming an inorganic alignment layer by emitting an alignment film material that is made of an inorganic material in an oblique direction onto a substrate, and forming an organic alignment layer that is a monomolecular film made of an organic material chemically bonded with the inorganic alignment layer on a surface of the inorganic alignment layer by treating the surface of the inorganic alignment layer with a silane coupling agent that has an alkyl group, wherein a pretilt angle of a liquid crystal molecule is set to a desired angle by selecting the silane coupling agent by the number of carbon atoms.

6 Claims, 7 Drawing Sheets

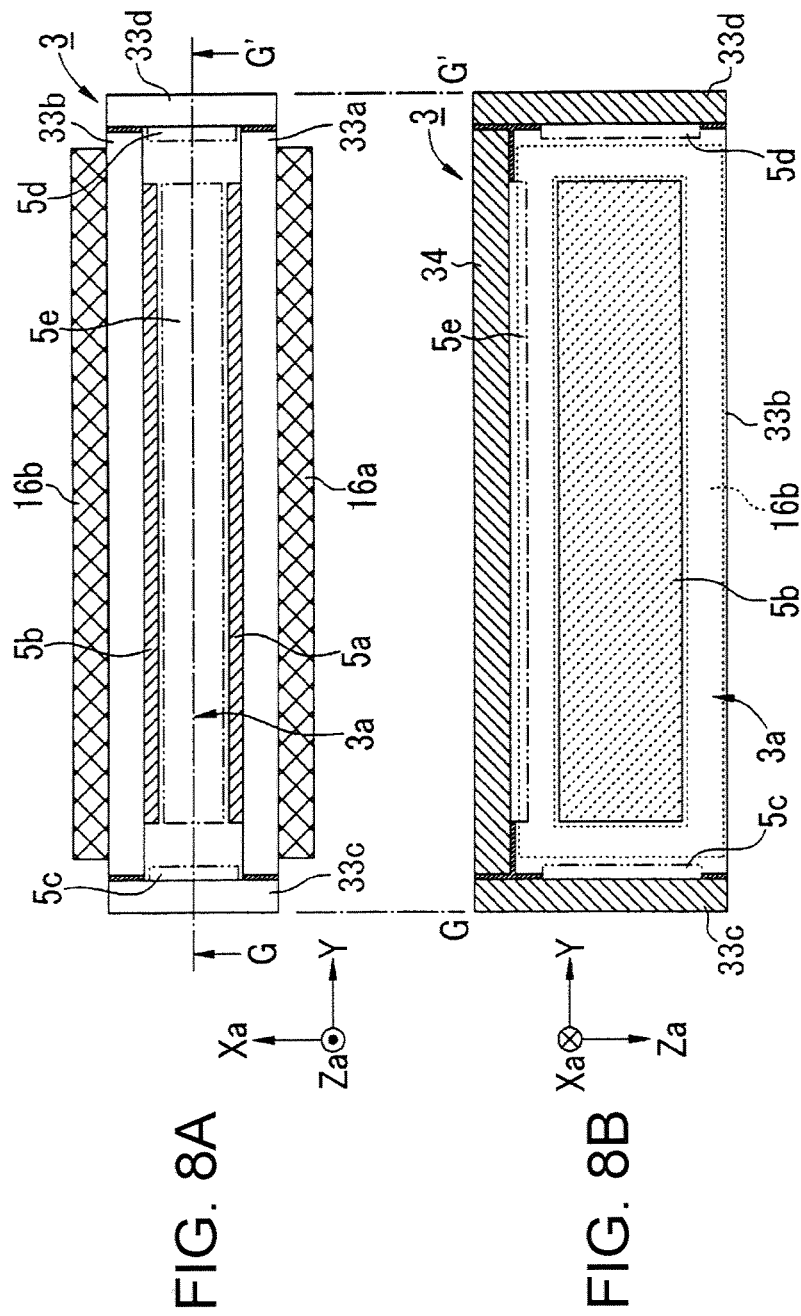

METHOD FOR MANUFACTURING LIQUID CRYSTAL DEVICE

CROSS-REFERENCE TO RELATED APPLICATION

This application is based on and claims priority from Japanese Patent Application No. 2008-128031, filed on May 15, 2008, the contents of which are incorporated herein by reference.

BACKGROUND

1. Technical Field

The present invention relates to a method for manufacturing a liquid crystal device.

2. Related Art

JP-A-2007-286401 is an example of related art. As described in the example, a method for manufacturing a liquid crystal device in which an inorganic alignment film is fabricated by using a manufacturing apparatus that includes a film forming chamber and sputtering equipment has been known. In the film forming chamber, the alignment film is formed of an alignment film forming material on a substrate by sputtering.

The example adopted a so-called facing target sputtering (FTS) method in which an inorganic alignment film is formed by using the sputtering equipment that has a pair of targets and the targets oppose each other with a plasma forming region therebetween.

The manufacturing apparatus disclosed in the example also has an electron capture means (a magnetic field generator) that traps or reflects electrons contained in the plasma forming region. Moreover an opening through which sputtered particles are emitted from the plasma forming region is disposed in the apparatus at a position where the sputtered particles obliquely fall onto a substrate.

In this way, it is avoided that an inorganic alignment film having an unintended configuration is formed because of plasma, and making it possible to obtain a fine inorganic alignment film.

However, the above-described method for manufacturing the liquid crystal device has an disadvantage that a pretilt angle of liquid crystal molecules becomes too small when an incident angle of the sputtered particle, which is the angle between the sputtered particle and a normal line of the substrate, is made small. This deteriorates a display quality of the liquid crystal device.

When the incident angle of the sputtered particle is made large, the pretilt angle of the liquid crystal molecules can be made large. However, in this case, a film formation rate is decreased. Moreover, a distance between the substrate and the opening of the sputtering equipment becomes large, which makes the whole size of the equipment too big.

Furthermore, when the inorganic alignment film fabricated by the FTS method is made of silicon oxide, many polarized hydroxyl groups exist on the surface of the film and these hydroxyl groups weaken a moisture-proof property of the inorganic alignment film. As a result, resistance of the liquid crystal device to moisture and light is decreased.

SUMMARY

An advantage of the present invention is to provide a method for manufacturing a liquid crystal device with which a desired pretilt angle of liquid crystal molecules and a fine film formation rate are obtainable, downsizing of the manufacturing apparatus is possible and with which an alignment film with a fine moisture-proof property and a high light resistance can be formed.

A method for manufacturing a liquid crystal device that has a liquid crystal layer interposed between a pair of substrates which oppose each other and an alignment film which is formed on an inner face side of at least one of the substrates according to the invention includes forming an inorganic alignment layer that has a plurality of columnar structures in which crystals grow in an oblique direction with respect to a normal line of the substrate by using sputtering equipment in which a pair of targets oppose each other with a plasma forming region interposed therebetween, by emitting an alignment film material that is made of an inorganic material in an oblique direction onto the substrate from the targets, and forming an organic alignment layer that is a monomolecular film made of an organic material chemically bonded with the inorganic alignment layer on a surface of the inorganic alignment layer by treating the surface of the inorganic alignment layer with a silane coupling agent that has an alkyl group, and a pretilt angle of a liquid crystal molecule is set to a desired angle by selecting the silane coupling agent by the number of carbon atoms.

According to the method, plasma is generated between the pair of the targets in the sputtering equipment at the time of formation of the inorganic alignment layer, and it is possible to prevent the inorganic alignment layer on the substrate from being affected by the plasma.

Moreover, according to the method, at the time when the organic alignment layer is formed by treating the surface of the inorganic alignment layer, it is possible to adjust the pretilt angle of the alignment film to a desired angle with the silane coupling agent. Therefore it is not necessary to increase an emission angle of the alignment film material in order to obtain a large pretilt angle. As a result, it is possible to prevent deterioration of a film forming rate and growth in size of the apparatus.

In addition, even when the inorganic alignment layer is made of for example silicon oxide, the silane coupling agent reacts with polarized hydroxyl groups existing in the surface of the inorganic alignment layer so that the hydroxyl groups will not deteriorate or give an adverse effect to the liquid crystal.

In this way, it is possible to provide a method for manufacturing a liquid crystal device with which a desired pretilt angle of liquid crystal molecules and a fine film formation rate are obtainable, downsizing of the manufacturing apparatus is possible and with which an alignment film with a fine moisture-proof property and a high light resistance can be formed.

It is preferable that the sputtering equipment emit the alignment film material at an emission angle of less than 60° with respect to the normal line direction of the substrate.

In this way, the decrease in the film formation rate can be prevented. At the same time, the distance between the substrate and the sputtering equipment can be shorten thereby it is possible to downsize the manufacturing apparatus.

It is also preferable that the emission angle with respect to the normal line direction be 45° or less.

In this way, a fine film formation rate can be obtainable. At the same time, the distance between the substrate and the sputtering equipment can be further shorten thereby it is possible to downsize the manufacturing apparatus.

It is preferable that the silane coupling agent with the number of the carbon atoms of 6 to 18 both inclusive be used.

In this way, it is possible to set the pretilt angle of the alignment film to in the range of about 3° to 8° both inclusive.

It is also preferable that the silane coupling agent with the number of the carbon atoms of 8 to 10 both inclusive be used.

In this way, it is possible to manufacture the alignment film that has both the moisture resistance and the light resistance.

It is also preferable that the silane coupling agent with the number of the carbon atoms of 10 or more but less than 18 be used.

In this way, it is possible to set the pretilt angle of the alignment film to in the optimum range of about 4° to 6° both inclusive. Consequently it is possible to improve a display quality of the liquid crystal device.

Moreover, it is preferable that the pretilt angle is set to 3° or more from the normal line direction.

In this way, it is possible to prevent the display quality of the liquid crystal device from being deteriorated.

BRIEF DESCRIPTION OF THE DRAWINGS

The invention will be described with reference to the accompanying drawings, wherein like numbers reference like elements.

FIG. 7 illustrates an apparatus for manufacturing the liquid crystal device according to an embodiment.

FIG. 8 illustrates the sputtering equipment according to the embodiment, FIG. 8A is a plan view of the sputtering equipment and FIG. 8B is a fragmentary view taken in a direction of the arrows G, G' in FIG. 8A.

DESCRIPTION OF EXEMPLARY EMBODIMENTS

Embodiments of the invention will be described. In the accompanying drawings, a scale size may be different among members or layers in order to make each member or layer recognizable for illustration purpose.

Figure 1:
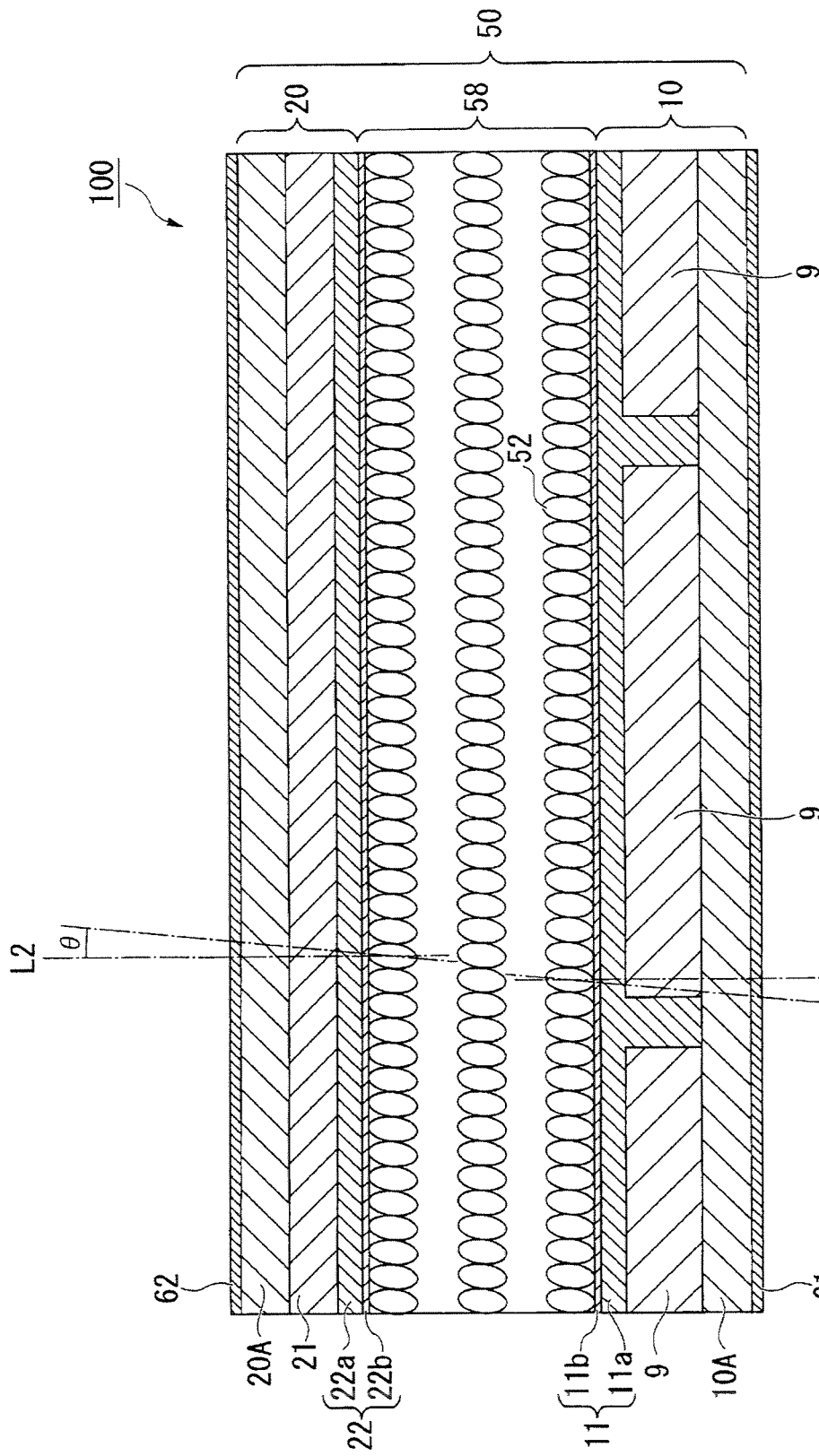
FIG. 1 is a sectional view of a liquid crystal device according to an embodiment of the invention.

FIG. 1 schematically illustrates a sectional structure of a liquid crystal device according to an embodiment of the invention. Schematic features of the liquid crystal device of the embodiment will be described with reference to FIG. 1.

Liquid Crystal Device

Referring to FIG. 1, a liquid crystal device 100 according to the embodiment has a liquid crystal panel 50. The liquid crystal panel 50 includes a circuit substrate 10 and a counter substrate 20 which is disposed so as to oppose the circuit substrate 10 with a liquid crystal layer 58 interposed therebetween. The liquid crystal layer 58 is made of a liquid crystal material including a liquid crystal molecule 52 whose initial alignment is vertical orientation and whose dielectric anisotropy property is negative.

The circuit substrate 10 includes a substrate body 10A that is made of an optically transparent material such as glass. A pixel electrode 9 is provided on an inner face side (the side closer to the liquid crystal layer 58) of the substrate body 10A. The pixel electrode has a rectangular shape when viewed in plan and is made of a transparent conductive material such as indium tin oxide (ITO). The circuit substrate 10 further includes a thin film transistor (TFT) element, a data line to which an image signal is supplied, a scan line, a light shielding film and the like (all of these components are not shown in the drawing). The TFT element is a switching element for controlling current supply to the pixel electrode 9. The pixel electrode 9 is provided in the plural number and an alignment film 11 is disposed so as to cover the plurality of the pixel electrodes 9 on the inner face side of the circuit substrate 10.

The counter substrate 20 includes a substrate body 20A that is made of an optically transparent material such as glass. A common electrode 21 that is made of a transparent conductive film such as ITO is provided on an inner face side of the substrate body 20A. The common electrode 21 is formed in a blanket-deposited manner on the substantially whole face of the substrate body 20A. The counter substrate 20 can further include a color filter, a light shielding film and the like (not illustrated in the drawing). An alignment film 22 is provided on the inner face side of the counter substrate 20 so as to cover the common electrode 21.

The alignment film 11 of the circuit substrate 10 and the alignment film 22 of the counter substrate 20 have a function to provide a pretilt angle θ to the liquid crystal molecules 52. The liquid crystal molecules 52 forming the liquid crystal layer 58 is vertically aligned with a predetermined pretilt angle θ which is determined by the alignment films 11, 22 at an initial alignment state (when no voltage is applied).

Figure 2:
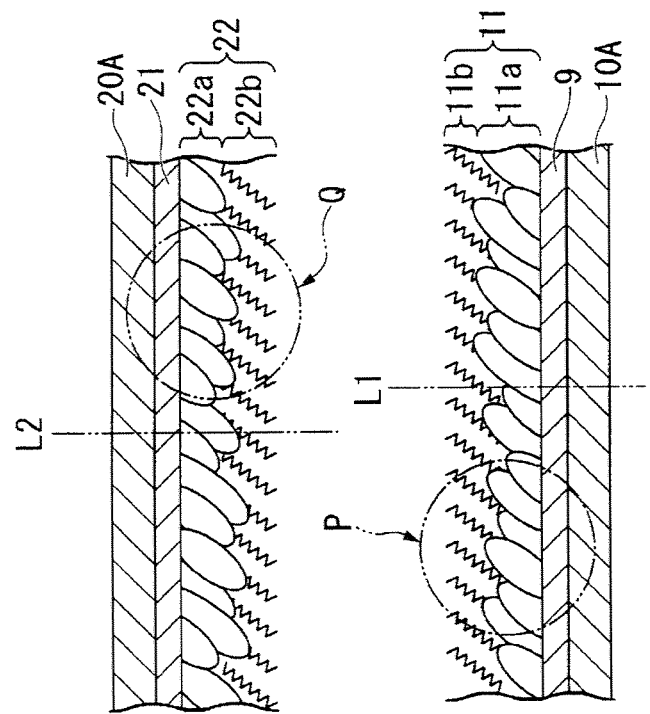
FIGS. 2A and 2B are enlarged sectional views of an alignment film according to an embodiment.
Figure 3:
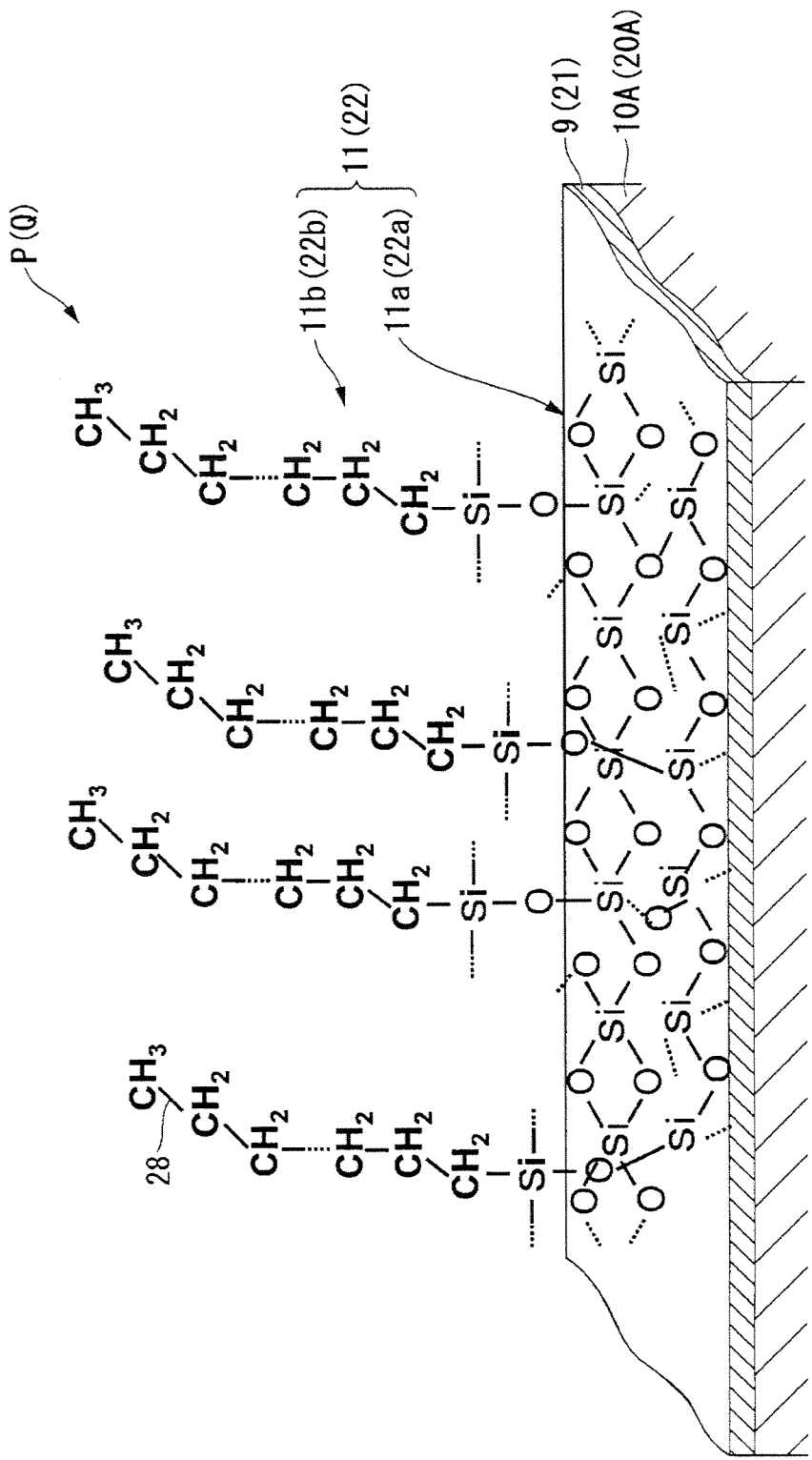
FIG. 3 is an enlarged fragmentary view of parts P, Q in FIG. 2.

FIG. 2A and FIG. 2B are enlarged sectional views of the alignment film 11 of the circuit substrate 10 and the alignment film 22 of the counter substrate 20 respectively. FIG. 3 is an enlarged fragmentary view showing parts (parts P, Q circled in dashed line) in FIG. 2A and FIG. 2B.

Referring to FIG. 2A and FIG. 2B, the alignment films 11, 22 include inorganic alignment layers 11a, 22a and organic alignment layers 11b, 22b respectively.

The inorganic alignment layers 11a, 22a are made of for example silicon oxide such as $SiO_2$ and SiO. The inorganic alignment layers 11a, 22a have a plurality of columnar structures in which crystals grow in an oblique direction with respect to normal lines L1, L2 of the circuit substrate 10 and the counter substrate 20 respectively. In this way, the inorganic alignment layers 11a, 22a respectively provide the pretilt angle θ of for example about 1.2° to the liquid crystal molecule 52.

The organic alignment layers 11b, 22b are made of a monomolecular film that is made from an organic material which is chemically bonded with the inorganic alignment layers 11a, 22a. More specifically, referring to FIG. 3, the organic material is mainly made of an alkyl chain 28 that is coupled with a Si atom of the inorganic alignment layers 11a, 22a. The number of the carbon atoms in the alkyl chain 28 used here is 6 to 18 (both inclusive).

Referring to FIG. 1, a pair of polarization plates 61, 62 is provided on the both sides of the liquid crystal panel 50. The polarization plates 61, 62 are disposed such that their polarizing axes are placed at angles of about 45°, 135° respectively from an orientation angle of the liquid crystal, and the polarizing axes are crossed each other at a substantially orthogonal angle. An unshown light source unit is provided on an outer side (a side adjacent to the polarization plate 61) of the polarization plate 61.

In the liquid crystal device 100 having the above-described structure, the liquid crystal molecule 52 is vertically aligned and has a predetermined pretilt angle θ when no voltage is applied.

The liquid crystal molecules 52 in the liquid crystal layer 58 are laid substantially in parallel to the substrate face by applying a voltage between the pixel electrode 9 and the common electrode 21. At this point, the direction in which the liquid crystal molecules 52 are laid can be determined by the pretilt angle θ.

Figure 4:
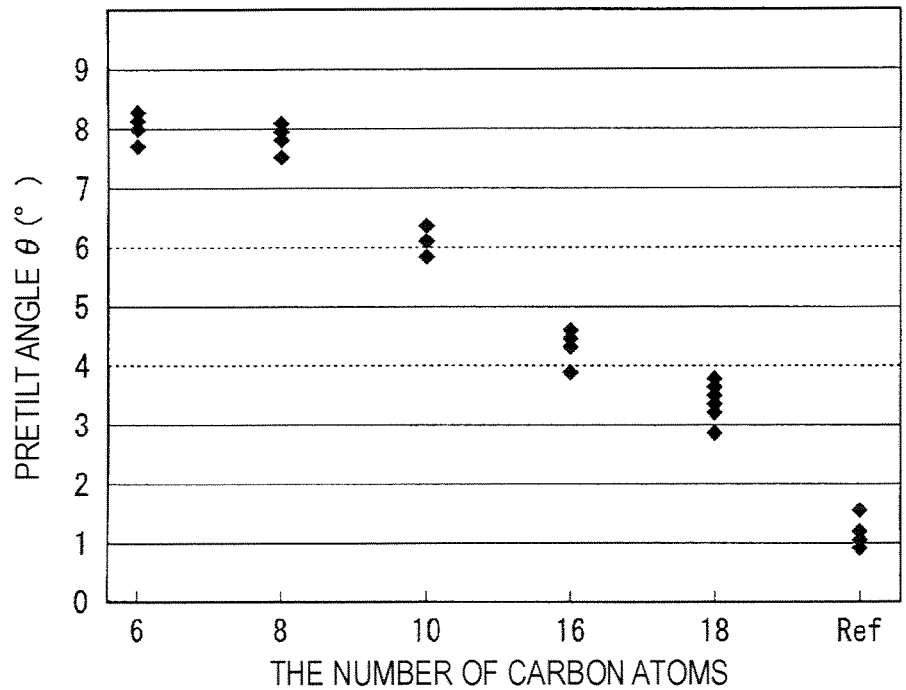
FIG. 4 is a chart showing a relation between the number of carbon atoms of an organic alignment layer according to the embodiment and a pretilt angle θ.

FIG. 4 is a chart showing a relation between the number of carbon atoms and the pretilt angle θ, the horizontal axis is the number of the carbon atoms in the alkyl group of the organic alignment layer 11*b*, 22*b*, and the vertical axis is the pretilt angle θ.

Referring to FIG. 4, "Ref" in the horizontal axis referrers to a reference inorganic alignment film that consists of only the inorganic alignment layers 11*a*, 22*a*. More specifically, the inorganic alignment layers 11*a*, 22*a* of the liquid crystal device 100 has a function to give the pretilt angle θ of about 1° to 1.5° to the liquid crystal molecule 52.

When the number of the carbon atoms in the alkyl group of the organic alignment layer 11*b*, 22*b* is 6 to 18 (both inclusive), the pretilt angle θ can be set in the range of about 3° to 8° as shown in FIG. 4.

When the number of the carbon atoms 10 or more but less than 18, more specifically, 10 to 16 (both inclusive) or 10 to 17 (both inclusive), the pretilt angle θ can be set in the preferable range of about 4° to 6° which is indicated by the dashed line in the drawing. In this way, it is possible to align the liquid crystal molecules in the desired direction securely thereby it is possible to improve a display quality of the liquid crystal device.

Figure 5:
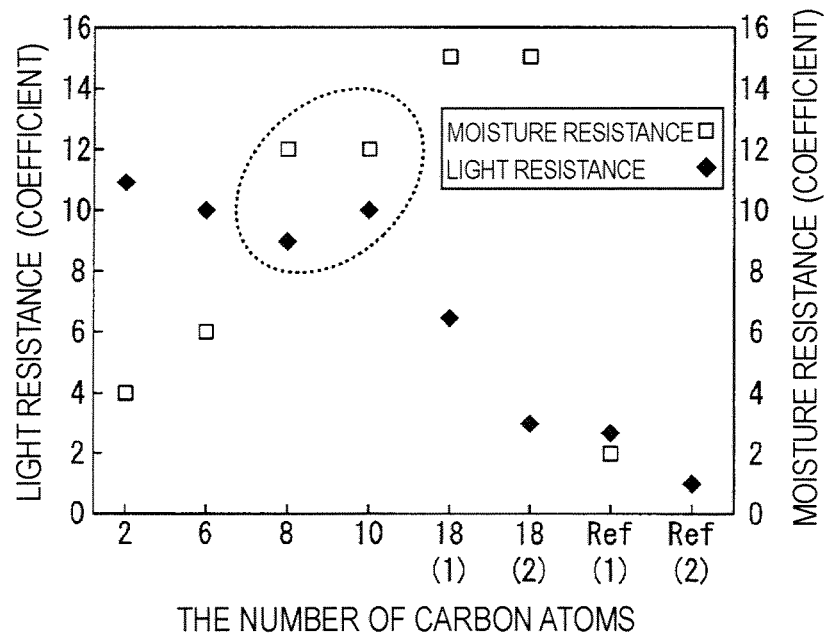
FIG. 5 is a chart showing a relation between the number of the carbon atoms of the organic alignment layer according to the embodiment and resistances to light and moisture.

FIG. 5 is a chart showing a relation between the number of the carbon atoms in the alkyl group and resistances to light and moisture, the horizontal axis is the number of the carbon atoms in the alkyl group of the organic alignment layer 11*b*, 22*b*, and the vertical axes are the resistances to light and moisture.

In the chart, a square mark (□) denotes the resistance to moisture, and a rhomboid mark (♦) denotes the resistance to light. "Ref (1)" in the horizontal axis referrers to a reference inorganic alignment film that consists of only the inorganic alignment layers 11*a*, 22*a*. "Ref (2)" referrers to another reference inorganic alignment film that is made of polyimide and to which a rubbing treatment has been performed. The value of the light resistance in the vertical axis is a coefficient where the light resistance of the polyimide alignment film referred as "Ref (2)" is 1. The scale of the vertical axis showing the moisture resistance in FIG. 5 is a coefficient of time period of an acceleration test where 500 hours equals to 3, the condition of the acceleration test is 60° C. of temperature and 90% of humidity.

Referring to FIG. 5, when the number of carbon atoms in the alkyl group of the organic alignment layers 11*b*, 22*b* is 6 to 18 (both inclusive), better resistances to moisture and light can be obtained compared to a normal polyimide alignment film and to an inorganic alignment film alone.

Moreover, when the number of the carbon atoms is 8 to 10 (both inclusive), it is possible to obtain the alignment films 11, 22 that have a fine durability with high resistances to light and moisture, which is shown in the area circled by the dashed line in FIG. 5.

Figure 6:
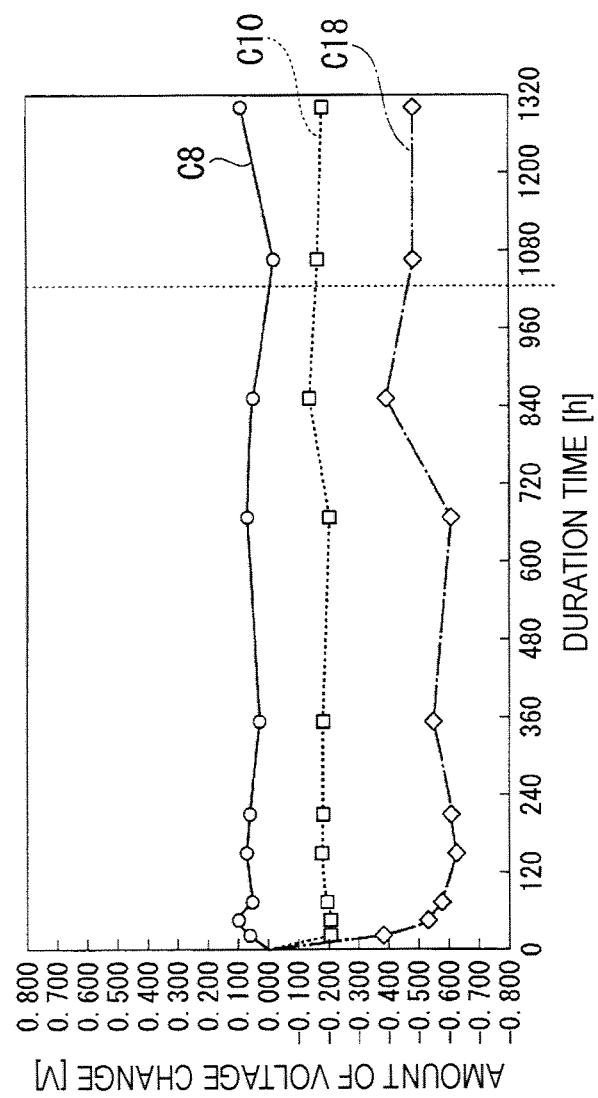
FIG. 6 is a chart showing a relation between a duration time and the amount of change in voltage at the time a voltage is applied to the liquid crystal device according to the embodiment.

FIG. 6 is a chart showing a relation between a duration time and the amount of change in a voltage at the time when the voltage is applied between the pixel electrode 9 and the common electrode 21 in the liquid crystal device 100, the horizontal axis is the duration time and the vertical axis is the amount of change in the voltage.

Referring to the chart, a solid line C8 represents the alignment films 11, 22 having the organic alignment layers 11*b*, 22*b* in which the number of the carbon atoms in the alkyl group is 8. A dashed line C10 in the chart represents the alignment films 11, 22 having the organic alignment layers 11*b*, 22*b* in which the number of the carbon atoms in the alkyl group is 10, and a dashed-dotted line C18 in the chart represents the alignment films 11, 22 having the organic alignment layers 11*b*, 22*b* in which the number of the carbon atoms is 18

Referring to FIG. 6, the amount of change in the voltage between the pixel electrode 9 and the common electrode 21 can be controlled within the range of +0.1 V to −0.2 V by setting the number of the carbon atoms of the organic alignment layers 11*b*, 22*b* to 8 to 10 (both inclusive). When the number of the carbon atoms is 8, the amount of the voltage change can be kept in the range of about 0 V to +0.1 V. When the number of the carbon atoms is 10, the change in the voltage can be limited in the range of about −0.1 V to −0.2 V.

In other words, by selecting the number of the carbon atoms of the organic alignment layers 11*b*, 22*b*, it is possible to balance permittivity between the substrate 10 and the substrate 20 at the time when a voltage is applied between the common electrode 21 and the pixel electrode 9. Therefore electric asymmetry between the substrates 10, 20 will hardly occur and a LCcom variation due to longtime driving is refrained. Consequently it is possible to improve the display quality.

Apparatus for manufacturing the liquid crystal device

An apparatus for manufacturing the liquid crystal device 100 according to the embodiment will be now described.

Figure 7A:
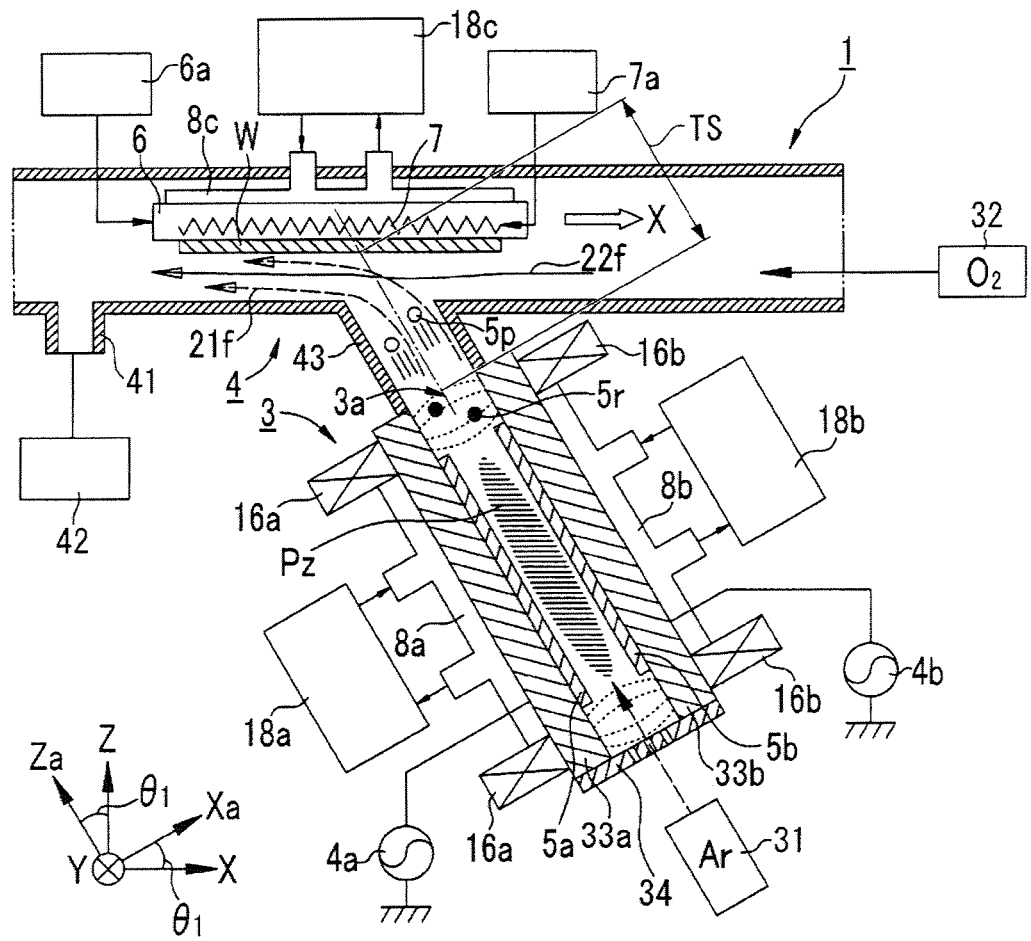
FIG. 7A is a schematic configuration diagram of the manufacturing apparatus and FIG. 7B is a side view of sputtering equipment showing its configuration.
Figure 7B:
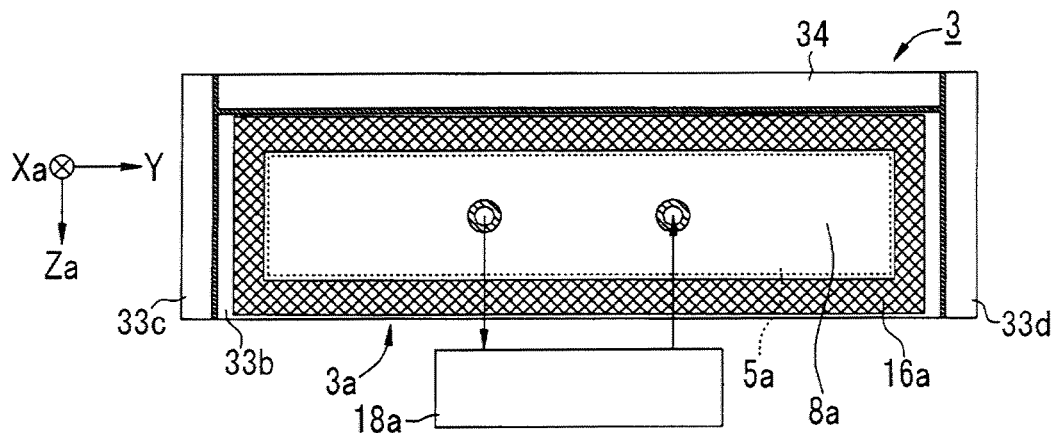

FIG. 7A is a schematic configuration diagram of an apparatus for manufacturing the liquid crystal device 100 of the embodiment. FIG. 7B is a side view of sputtering equipment 3 which is viewed in an Xa direction showing its configuration.

Referring to FIG. 7A, a manufacturing apparatus 1 is a machine that forms the inorganic alignment layers 11*a*, 22*a* on a substrate W by sputtering. The substrate W encompasses a substrate that is a component of the liquid crystal device 100 such as the circuit substrate 10 and the counter substrate 20. The manufacturing apparatus 1 includes a film forming chamber 4 that is a vacuum chamber in which the substrate W is placed, and the sputtering equipment 3 with which the inorganic alignment layers 11*a*, 22*a* made of an inorganic material are formed on a surface of the substrate W by a sputtering method. The sputtering equipment 3 has a gas supplier 31 through which an argon gas for electric discharge is supplied to a plasma forming region. The film forming chamber 4 has a gas supplier 32 through which an oxygen gas is supplied. The oxygen gas is used as a reactive gas that reacts with the alignment film material flying over the substrate W inside the film forming chamber and the inorganic alignment layers 11*a*, 22*a* are formed.

An exhaust control unit 42 for controlling an internal pressure and obtaining a desired degree of vacuum is coupled to the film forming chamber 4 through a pipe 41. An equipment coupling part 43 which is a part coupling the film forming chamber and the sputtering equipment 3 is provided such that it protrudes outside from a lower wall of the film forming chamber 4 as shown in the drawing. The equipment coupling part 43 extends in an oblique direction at a predetermined angle θ1 with respect to a normal line direction (the Z axis direction in the drawing) of the film formation face of the substrate W which is placed inside the film forming chamber 4. Thereby the sputtering equipment 3 that is jointed at the tip of the equipment coupling part is disposed slantwise at the predetermined angle θ1 with respect to the substrate W.

The gas supplier 32 is coupled to the equipment coupling part 43 at the side opposite to the exhaust control unit 42. The oxygen gas supplied from the gas supplier 32 flows in the direction designated by the arrow 22f in the drawing, more specifically from +X side of the film forming chamber 4 toward the exhaust control unit 42 side which is −X direction in the drawing through over the substrate W.

In an actual manufacturing apparatus, provided is a load lock chamber with which makes it possible to carry the substrate W in and out of the film forming chamber 4 while maintaining the chamber as a vacuum. The load lock chamber is installed outside the film forming chamber 4 in the X axis direction. The load lock chamber is also coupled to an exhaust control unit that separately controls a vacuum atmosphere inside the load lock chamber. The load lock chamber and the film forming chamber 4 are coupled through a gate valve that air-tightly closes between the chambers. With such feature, it is possible to take the substrate W in and out from the chamber without exposing the film forming chamber 4 to the air.

The sputtering equipment 3 is counter target type sputtering equipment in which two targets 5a, 5b oppose each other. The target 5a is attached to a first electrode 33a which has a substantially plate shape, and the target 5b is attached to a second electrode 33b which also has a substantially plate shape. The targets 5a, 5b that are supported by the first electrode 33a and the second electrode 33b respectively are made of a material containing at least one of the constituents of the inorganic alignment layers 11a, 22a provided on the substrate W, such material can be for example silicon. The targets 5a, 5b have a long and narrow plate shape extending in the Y direction in the drawing (see FIG. 8), and they are disposed such that their opposing faces become parallel each other.

The first electrode 33a is coupled to a power source 4a which is a direct-current (DC) power source or high-frequency power source, and the second electrode 33b is coupled to a power source 4b which is a DC power source or high-frequency power source. Electric power that is supplied from the power sources 4a, 4b generates plasma Pz in a space (the plasma forming region) between the target 5a and the target 5b.

A cooling unit 8a that cools the target 5a is provided at the side opposite to the target 5a of the first electrode 33a. A refrigerant circulator 18a is coupled to the cooling unit 8a through a pipe and the like. A cooling unit 8b that cools the target 5b is provided at the side opposite to the target 5b of the second electrode 33b. A refrigerant circulator 18b is coupled to the cooling unit 8b through a pipe and the like. Referring to FIG. 7B, the cooling unit 8a has a substantially same planar size with the target 5a and is disposed so as to overlap with the target 5a when viewed in plan with the first electrode 33a interposed therebetween. Though not shown in the drawing, the cooling unit 8b is also disposed in the same manner so as to overlap with the target 5b when viewed in plan. The cooling units 8a, 8b respectively have a refrigerant flow passage in which refrigerant flows inside the units. The refrigerant supplied from the refrigerant circulators 18a, 18b to the refrigerant flow passage is circulated, which cools the targets 5a, 5b.

Referring to FIG. 7B, a magnetic field generator 16a which is a rectangular frame shaped permanent magnet, electromagnet, these magnet combined or the like is provided so as to surround the cooling unit 8a which has a rectangular shape when viewed in plan. A magnetic field generator 16b that is disposed so as to surround the cooling unit 8b, which is illustrated in FIG. 1A, also has the same feature.

The cooling units 8a, 8b can be made of a conductive material and can be electrically coupled to the first electrode 33a and the second electrode 33b respectively. In this case, the power sources 4a, 4b can be electrically coupled to the cooling units 8a, 8b respectively. Moreover, the refrigerant flow passage can be provided inside the first electrode 33a and the second electrode 33b so that the first electrode 33a and the second electrode 33b can also serve as the cooling unit.

FIG. 8 illustrates the configuration of the sputtering equipment 3 shown in FIG. 7A. FIG. 8A is a plan view of the sputtering equipment 3 when viewed from the side of the film forming chamber 4. FIG. 8B is a fragmentary view taken in the direction of the arrows G, G' in FIG. 8A.

Referring to FIG. 7 and FIG. 8, a box-shaped case serving as a vacuum chamber of the sputtering equipment 3 is formed of the first electrode 33a, the second electrode 33b, a side wall 34 to which one end (the edge on the −Za axis side) of the first electrode and the second electrode is coupled, and side walls 33c, 33d to which both ends of the first electrode 33a and the second electrode 33b are coupled in the Y axis direction. Note that the first electrode 33a, the second electrode 33b, and the side walls 33c, 33d, 34 that form the box-shaped case are insulated each other. The box-shaped case has an opening 3a through which a sputtered particle 5p is emitted at its edge part which is disposed at the side opposite to the side wall 34 of the first electrode 33a and the second electrode 33b. The box-shaped case is coupled to the equipment coupling part 43 that protrudes out in the film forming chamber 4 through the opening 3a. In this way, the inside of the box-shaped case communicates with the inside of the film forming chamber 4.

Referring to FIG. 7A, the gas supplier 31 is coupled to the side wall 34 that is disposed at the side opposite to the film forming chamber 4 with respect to the plasma forming region between the targets 5a, 5b. The argon gas supplied from the gas supplier 31 flows into the plasma forming region (target opposing region) from the side wall 34 side, then flow into the film forming chamber 4 through the equipment coupling part 43. The argon gas supplied into the film forming chamber 4 flows in the direction designated by the arrow 21f and joins the oxygen gas which is supplied from the gas supplier 32 and flows in the direction pointed by the arrow 22f. The both gases flow toward the exhaust control unit 42. In the manufacturing apparatus 1 according to the embodiment, the argon gas which is the sputtering gas flows along the Za direction in the drawing toward the film forming chamber 4, the argon gas then joins the oxygen gas that flows in −X direction in the film forming chamber 4, the jointed gas then flows in −X direction. The oxygen gas and the argon gas which are the sputtering gas joins each other at an acute angle thereby the sputtering gas smoothly circulates. In this way, it is possible to prevent a gas flow at the joint point of the oxygen gas and the argon gas from being disturbed. As a result, it is possible to prevent that incident angles of the sputtered particle 5p with respect to the substrate W vary largely.

The magnetic field generator 16a is disposed at the side opposite to the target 5a of the first electrode 33a, and the magnetic field generator 16b is disposed at the side opposite to the target 5b of the second electrode 33b. Referring to FIG. 8B, the magnetic field generator 16b has a rectangular frame shape which is arranged along the outer edge of the rectangular target 5b, and the magnetic field generator 16a has the same shape. The magnetic field generator 16a and the magnetic field generator 16b oppose each other in the outer edge part of the targets 5a, 5b that also oppose each other. The magnetic field generators 16a, 16b generate a magnetic filed of the Xa direction that encompasses the targets 5a, 5b in the sputtering equipment 3. The magnetic field serves as the electron capture means that traps the electrons contained in the plasma Pz.

A substrate holder 6 that supports a treated face (film forming face) of the substrate W horizontally (in parallel to the XY plane) is provided below the sputtering equipment 3. A carrier 6a that moves the substrate holder 6 horizontally from the side of the unshown load lock chamber to the opposite side is coupled to the substrate holder 6. Referring to FIG. 1, the direction in which the substrate W is moved by the carrier 6a is parallel to the X axis direction and orthogonal to the longitudinal direction (Y axis direction) of the targets 5a, 5b.

The substrate holder 6 has a heater 7 (heating means) for heating the substrate W held by the holder. The substrate holder 6 further has a cooler 8c for cooling the substrate W held by the holder. The heater 7 is coupled to a controller 7a that includes a power supply and the like. The heater heats up the substrate holder 6 to a desired temperature through a heating operation that is controlled by the controller 7a and the substrate W is heated to a desired temperature. The cooler 8c is coupled to the substrate holder 6 through a refrigerant circulator 18c, a pipe and the like. The substrate holder 6 is cooled to a desired temperature by circulating the refrigerant supplied from the refrigerant circulator 18c and the substrate W is cooled to a desired temperature.

When the manufacturing apparatus 1 forms the inorganic alignment film on the substrate W which is a component of the liquid crystal device, a DC power (RF power) is supplied to the first electrode 33a and the second electrode 33b while the argon gas is introduced from the gas supplier 31. The plasma Pz is generated in the space between the targets 5a, 5b, argon ions and the like in the plasma atmosphere are then collided to the targets 5a, 5b, and an alignment film material (silicon) is sputtered out from the targets 5a, 5b as the sputtered particle 5p. At the same time, among the sputtered particles 5p contained in the plasma Pz, only the sputtered particles 5p that fly from the plasma Pz to the side of the opening 3a are selectively emitted toward the film forming chamber 4 side. The sputtered particles 5p that fly in an oblique direction onto the substrate W is reacted with the oxygen gas that circulates in the film forming chamber 4 on the substrate W. In this way, the inorganic alignment layers 11a, 22a that are made of silicon oxide are formed on the substrate W.

Method for Manufacturing the Liquid Crystal Device

A method for manufacturing the liquid crystal device 100 according to the embodiment will be now described. In the following description, a method for forming the alignment films 11, 22 are mainly described. The description starts from a step after the formation of wiring lines such as the scan lines, the data lines and capacitor lines, drive circuit elements such as TFT, the pixel electrodes 9, the common electrode 21 and the like have been completed in the circuit substrate 10 and the counter substrate 20.

A step of forming the inorganic alignment layer 11a and the organic alignment layer 11b on the inner face side of the circuit substrate 10 by using the above-described manufacturing apparatus 1 will be also hereunder described. A process of forming the inorganic alignment layer 22a and the organic alignment layer 22b on the inner face side of the counter substrate 20 is same as a manufacturing process of forming the inorganic alignment layer 11a and the organic alignment layer 11b therefore its description is hereunder omitted.

Inorganic Alignment Layer Forming Step

Referring to FIG. 7, the circuit substrate 10 is fixed onto the substrate holder 6, then moved and disposed at a predetermined position in the film forming chamber 4 by the carrier 6a. Subsequently, the counter target type sputtering equipment 3 that is disposed at the predetermined angle θ1 from the circuit substrate 10 sputters out the sputtered particles 5p which are emitted from the opening 3a as the alignment film material. The sputtered particles enter obliquely onto the film forming face of the circuit substrate 10 at the predetermined angle θ1.

In the above-described manner, the sputtered particles 5p which are the alignment film material fall obliquely onto the circuit substrate 10 and are deposited on the film forming face. In this way, referring to FIG. 2B, the inorganic alignment layer 11a having a plurality of the columnar structures in which crystals grow in an oblique direction with respect to the normal line L1 of the circuit substrate 10 is obtained.

At this point, the angle θ1 of the sputtering equipment 3 is set to smaller than 60° in the manufacturing apparatus 1, and the emission angle of the sputtered particle 5p with respect to the normal line L1 (Z axis direction in FIG. 7) of the circuit substrate 10 is preferably set to smaller than 60° in the sputtering equipment 3. In this embodiment, the manufacturing apparatus 1 is configured such that the angle θ1 is 45° and the emission angle of the sputtered particle 5p with respect to the normal line L1 of the circuit substrate 10 is set to 45° or smaller.

Table 1 shows a relation between the emission angle (film forming angle) of the sputtered particle 5p and properties of the formed inorganic alignment layer 11a and a distance TS (see FIG. 7) between the sputtering apparatus 3 and the film forming face of the circuit substrate 10.

TABLE 1

|  | Film forming angle (°) | | |
| --- | --- | --- | --- |
|  | 45 | 60 | 80 |
| Pretilt angle (°) | 1.2 | 2.5 | 3.8 |
| Film thickness (nm) | 97 | 85 | 62 |
| Distance TS (mm) | 150 | 250 | 1300 |

As shown in Table 1, when the film forming angle is 45°, the pretilt angle (pretilt capability) which the inorganic alignment layer 11a can provide to the liquid crystal molecule 52 was about 1.2°. In this case, the film thickness of the inorganic alignment layer 11a after the sputtered particles 5p were deposited for a predetermined time period was about 100 nm. The distance TS between the sputtering apparatus 3 and the film forming face of the circuit substrate 10 was about 150 mm.

When the film forming angle is about 60°, the pretilt capability of the inorganic alignment layer 11a can be increased to about 2.5°. However the distance TS between the sputtering apparatus 3 and the film forming face of the circuit substrate 10 is also increased (doubled) to about 250 mm so that the film formation rate decreased and it will take about twice longer to fabricate the film compared to the case of the film forming angle of about 45°.

When the film forming angle is about 80°, the pretilt capability of the inorganic alignment layer 11a can be increased to about 3.8°. However the distance TS between the sputtering apparatus 3 and the film forming face of the circuit substrate 10 is significantly increased to about 1300 mm so that the film formation rate drops dramatically and it will take about seventy times longer to fabricate the film compared to the case of the film forming angle of about 45°.

Considering the facts above, it is preferable that the film forming angle be as small as possible. More specifically, it is preferable that the angle is smaller than 60°. In this way, it is possible to prevent the film formation rate of the inorganic alignment layer 11a from being lowered and prevent the production rate of the liquid crystal device 100 from being decreased. At the same time, the distance TS between the circuit substrate 10 and the sputtering apparatus 3 can be made smaller than 250 mm and it is possible to downsize the manufacturing apparatus 1.

Moreover, according to the embodiment, the film formation rate of the inorganic alignment layer 11a can be further improved by setting the film forming angle to 45°. In this way, it is possible to improve the production rate of the liquid crystal device 100. Furthermore, the distance TS between the circuit substrate 10 and the sputtering apparatus 3 can be made as small as 150 mm and it is possible to further downsize the manufacturing apparatus 1.

According to the embodiment, the sputtered particles that are not emitted from the opening 3a in the counter target type sputtering equipment 3 are mostly entered onto the targets 5a, 5b and reused. Therefore it is possible to obtain a very high target use efficiency. The sputtering equipment 3 can enhance the directivity of the sputtered particles 5p emitted from the opening 3a by narrowing the distance between the targets. Thereby an incident angle θ1 of the sputtered particle 5p arriving on the circuit substrate 10 can be highly controlled and it is possible to obtain finely aligned columnar structures in the formed inorganic alignment layer 11a.

In the process of forming the inorganic alignment layer 11a, a magnetic field that is generated by the rectangular-frame shaped magnetic field generators 16a, 16b surrounding the targets 5a, 5b of the sputtering equipment 3 can capture or reflect electrons 5r contained in the plasma Pz. In this way, the plasma Pz can be securely trapped in the space between the opposing targets 5a, 5b. As a result, it is possible to prevent wettability of the substrate W surface from being increased due to the above mentioned electrons 5r that enter onto the film forming face of the substrate W. Therefore the formation of the column structure will not be disturbed since the sputtered particles 5p once attached to the circuit substrate 10 will not be relocated. Moreover, it is possible to improve a coating property of a silane coupling agent which will be hereunder described when the organic alignment layer 11b is formed.

It is preferable that electric potentials of walls of the film forming chamber 4 and the equipment coupling part 43 which exist between the opening 3a and the circuit substrate 10 be retained as a ground potential. In this way, electrons that are leaked from the electron capture means can be trapped and removed by the walls and it is possible to effectively prevent the wettability of the surface of the circuit substrate 10 from being increased.

Energy of the sputtered particle 5p (alignment film material) emitted from the target by sputtering is for example 10 eV which is significantly high compared to energy of a cluster particle generated from an evaporation source by a deposition method, which is for example 0.1 eV. This means an adhesion property of the sputtered particle 5p is higher than that of the cluster particle generated by the deposition method. More specifically, in case of the cluster particle, the particle once attached to the inner wall faces of, for example, the film forming chamber 4 and the equipment coupling part 43 can be detached and fallen by vibration or the like, and it becomes foreign particles and it may be stuck on the circuit substrate 10. On the other hand, in case of the sputtered particle 5p, it will not be detached or fallen easily once attached to the inner wall face because of its high adhesion, and a trouble such that the particle sticks onto the substrate W as foreign particles will not occur.

Furthermore, since the cooler 8c for cooling the circuit substrate 10 is provided to the substrate holder 6, the circuit substrate 10 is cooled by the cooler 8c at the time of the film formation and the temperature of the circuit substrate 10 can be retained at a predetermined temperature such as a room temperature. In this way, it is possible to reduce diffusion (migration) of the alignment film material molecules attached onto the circuit substrate 10 by sputtering. Consequently growth of the alignment film material is promoted locally on the circuit substrate 10 and the inorganic alignment layer 11a in which the column structure grew in an uniaxial direction can be easily obtained.

Organic Alignment Layer Formation Step

The surface of the inorganic alignment layer 11a formed through the above-described process is treated with a silane coupling agent that has an alkyl group as a functional group. As the silane coupling agent, for example, one represented by the following formula (I) can be used.

$$C_nH_{2n+1}-Si-Y \qquad (1)$$

where Y can be an alkoxy group (—OR), halogen (—Cl) or the like, "n" is a positive integer that lies within the range of 6 to 18 (both inclusive).

A specific example of such silane coupling agent includes $CH_3(CH_2)_5Si(OCH_3)$ wherein the number of carbon atoms in the alkyl group is 6, $(C_6H_5)_2SiCl_2$ wherein the number of carbon atoms in the alkyl group is 12, and $CH_3(CH_2)_{17}Si(OH_3)$ wherein the number of carbon atoms in the alkyl group is 18.

Referring to FIG. 4, in the embodiment, the pretilt angle θ of the liquid crystal molecule 52 is set to a desired angle by selecting a silane coupling agent depending on the number of the carbon atoms.

There are two methods which can be applied to the surface treatment of the inorganic alignment layer 11a by using a silane coupling agent, one is a gas phase method and the other is a liquid phase method. According to the gas phase method, for example, the circuit substrate 10 on which the inorganic alignment layer 11a is formed is put into a chemical vapor deposition (CVD) apparatus, a silane coupling agent is introduced in a form of vapor, and the surface of the inorganic alignment layer 11a is treated with the vapor of the silane coupling agent. According to the liquid phase method, a silane coupling agent is dissolved in an adequate solvent and the surface of the inorganic alignment layer 11a is treated with the solution.

A specific example of the surface treatment method encompasses a contact processing including an apply method such as spin-coating and a spray method, a dipping method and the like. For example, when a surface part of the inorganic alignment layer 11a is treated by immersing the circuit substrate 10 into a silane coupling solution, it is preferable that ultrasonic sound be applied to the circuit substrate 10 and the solution or a treatment chamber be depressurized. With the ultrasonic wave treatment or the depressurize treatment, the silane coupling solution well gets through pores in the surface part of the inorganic alignment layer 11a and the solution is well reacted with silanol groups (Si—OH) in the pores.

On the inorganic alignment layer 11a to which the surface treatment has been performed as described above, the organic alignment layer 11b which is the monomolecular film made of the organic material having an organic functional group is provided.

Through the above described process, provided is the alignment film 11 in which the organic alignment layer 11b made of the organic monomolecular film that is chemically bonded with the inorganic alignment layer 11a is formed on the inorganic alignment layer 11a.

According to the embodiment, the pretilt angle θ of the liquid crystal molecule 52 is set to a desired angle by selecting the silane coupling agent which is used for the surface treatment of the inorganic alignment layer 11a depending on the number of the carbon atoms. For example, referring to FIG. 4, the pretilt angle θ which can be provided to the liquid crystal molecule 52 with the alignment film 11 can be set in the range of about 3° to 8° (both inclusive) by using the silane coupling agent having the number of the carbon atoms of 6 to 18 (both inclusive).

Referring to FIG. 5, when a silane coupling agent with the number of the carbon atoms of 8 to 10 (both inclusive) is, for example, used, it is possible to manufacture the alignment film 11 that has both the moisture resistance and the light resistance.

Referring to FIG. 4, when a silane coupling agent with the number of the carbon atoms of 10 or more but less than 18 is used, it is possible to set the pretilt capability of the alignment film 11 to an optimum range of about 4° to 6° (both inclusive). Consequently it is possible to improve the display quality of the liquid crystal device 100.

Moreover, by setting the pretilt angle θ of the liquid crystal molecule 52 to 3° or more, it is possible to prevent the display quality of the liquid crystal device 100 from being deteriorated.

Furthermore, the pretilt angle θ provided by the alignment film 11 can be adjusted to a desired angle by selecting a silane coupling agent which is used at the time when the inorganic alignment layer 11b is formed by conducting a surface treatment of the inorganic alignment layer 11a. This means that it is not necessary to increase the emission angle of the alignment film material in order to increase the pretilt angle θ. Therefore it is possible to prevent the film formation from being decreased and to avoid that the size of the manufacturing apparatus 1 gets large.

Moreover, even when the inorganic alignment layer 11a is made of silicon oxide, the organic alignment layer 11b can be formed on the surface of the inorganic alignment layer 11a and the organic alignment layer 11b can be chemically bonded to the silanol group through a side-chain alkyl group. Thereby activity of a hydroxyl group in the silanol group can be crippled. As a result, water adsorption and the like of the hydroxyl group in the inorganic alignment layer 11a can be eliminated.

As described above, according to the embodiment, it is possible to provide a method for manufacturing the liquid crystal device 100 in which the pretilt angle θ of the liquid crystal molecules 52 can be adjusted to a desired value and the alignment films 11, 22 having a high moisture resistance can be formed. Moreover, according to the embodiment, it is possible to provide a method for manufacturing the liquid crystal device 100 with which downsizing of the manufacturing apparatus 1 is possible and a fine film formation rate can be obtained.

Moreover the organic alignment layer 11b can align the liquid crystal molecules 52 finely with its organic functional groups. Furthermore, by covering the surface of the inorganic alignment layer 11a, a water-repellent property is provided to the surface and the moisture resistance and the light resistance can be enhanced. Micro sized pores in the surface of the inorganic alignment layer 11a are filled with the organic material so that the surface can be made dense. Thereby it is possible to increase adhesion between the inorganic alignment layer 11a and a sealant (not shown in the drawings) that adhesively bonds the circuit substrate 10 and the counter substrate 20 of the liquid crystal panel 50 and seals the liquid crystal layer 50. In this way, it is possible to increase airtightness in the sealing part interface between the inorganic alignment layer 11a and the sealant.

If a silane coupling agent having an alkyl chain with the number of carbon atoms of less than 6 is used, the alignment property which can be given to the liquid crystal is decreased and there is a possibility that the alignment film cannot fulfill its function. Whereas if the number of the carbon atoms is more than 18, a steric hindrance at the adjacent alkyl chain 28 becomes too large and attachments of the alkyl chains 28 onto the inorganic alignment layers 11a, 22a become uneven. For these reasons, the embodiment sets the number of the carbon atoms of the silane coupling agent to 6 to 18 (both inclusive), and the above-mentioned troubles will not occur.

The invention is obviously not limited to the specific embodiments described herein, but also encompasses any variations that may be considered by any person skilled in the art, within the general scope of the invention. For example, various silane coupling agents can be used provided that they satisfies with the above mentioned condition.

What is claimed is:

1. A method for manufacturing a liquid crystal device that has a liquid crystal layer interposed between a pair of substrates which oppose each other and an alignment film which is formed on an inner face side of at least one of the substrates, comprising:

forming an inorganic alignment layer that has a plurality of columnar structures in which crystals grow in an oblique direction with respect to a normal line of the substrate by using sputtering equipment in which a pair of targets made of silicon oppose each other with a plasma forming region interposed therebetween, by emitting an alignment film material that is made of either an SiO or an $SiO_2$ material in an oblique direction onto the substrate from the targets; and forming an organic alignment layer on a surface of the inorganic alignment layer by treating the surface of the inorganic alignment layer with a silane coupling agent having an alkyl group such that an Si atom of the silane coupling agent is directly bonded to oxygen of the SiO or $SiO_2$ material and the Si atom of the silane coupling agent bonds the alkyl group to the SiO or $SiO_2$ material, wherein the alkyl group is an alkyl chain consisting essentially of 6 to 18 carbon atoms, a pretilt angle of a liquid crystal molecule is set to a desired angle by selecting the silane coupling agent by the number of carbon atoms; and the organic alignment layer is a monomolecular film.

2. The method for manufacturing a liquid crystal device according to claim 1, wherein the sputtering equipment emits the alignment film material at an emission angle of less than 60° with respect to the normal line direction of the substrate.

3. The method for manufacturing a liquid crystal device according to claim 2, wherein the emission angle with respect to the normal line direction is 45° or less.

4. The method for manufacturing a liquid crystal device according to claim 1, wherein the silane coupling agent with the number of the carbon atoms of 8 to 10 both inclusive is used.

5. The method for manufacturing a liquid crystal device according to claim 1, wherein the silane coupling agent with the number of the carbon atoms of 10 or more but less than 18 is used.

6. The method for manufacturing a liquid crystal device according to claim 1, wherein the pretilt angle is set to 3° or more from the normal line direction.

\* \* \* \* \*